United States Patent [19]

Fukuzo et al.

[11] Patent Number: 4,692,642
[45] Date of Patent: Sep. 8, 1987

[54] ACTIVE PULL-UP CIRCUIT CONTROLLED BY A SINGLE PULL-UP CLOCK SIGNAL

[75] Inventors: Yukio Fukuzo; Yasukazu Inoue, both of Tokyo, Japan

[73] Assignee: NEC Corporation, Japan

[21] Appl. No.: 753,715

[22] Filed: Jul. 10, 1985

[30] Foreign Application Priority Data

Jul. 10, 1984 [JP] Japan ................ 59-143004

[51] Int. Cl.[4] ............................ H03K 3/356
[52] U.S. Cl. .................... 307/530; 307/269;
    307/355; 365/202; 365/205; 365/208
[58] Field of Search ........... 307/530, 355, 362, 269;
    365/190, 202, 203, 205, 207, 208

[56] References Cited

U.S. PATENT DOCUMENTS

| 4,144,590 | 3/1979 | Kitagawa et al. | 365/205 |
| 4,162,416 | 7/1979 | Beecham et al. | 365/208 X |
| 4,417,329 | 11/1983 | Mezawa et al. | 307/530 X |
| 4,441,171 | 4/1984 | Hoffmann | 365/205 |
| 4,475,178 | 10/1984 | Kinoshita | 365/203 |
| 4,504,929 | 3/1985 | Takemae et al. | 307/530 X |

FOREIGN PATENT DOCUMENTS 0040001 11/1981 European Pat. Off. ............ 307/530

30192 2/1982 Japan .................... 365/203

OTHER PUBLICATIONS

Ellis et al, "Controlled Gate Bit Line Boost Circuit"; IBM Tech. Discl. Bull.; vol. 24, No. 7B, pp. 3820-3822; 12/1981.

Lee et al, "A 80ns 5V-Only Dynamic RAM"; *IEEE ISSCC* 1979, Digest of Technical Papers.

Taniguchi et al, "Fully Boosted 64K DRAM with Automatic and Self-Refresh"; *IEEE JSSC*, vol. SC-16, No. 5, pp. 492-498; 10/1981.

*Primary Examiner*—Stanley D. Miller
*Assistant Examiner*—D. R. Hudspeth
*Attorney, Agent, or Firm*—Laff, Whitesel, Conte & Saret

[57] ABSTRACT

An improved active pull-up circuit which can be fabricated with reduced number of elements and operate with a small power consumption.

A first switch is provided between a refresh voltage terminal and a true circuit node to be pulled-up. A second switch controlled by a potential of a complementary circuit node is provided for operatively discharging the charge of a control electrode of the first switch. A pull-up clock is applied via a capacitor to the control electrode of the first switch.

6 Claims, 4 Drawing Figures

4,692,642

ACTIVE PULL-UP CIRCUIT CONTROLLED BY A SINGLE PULL-UP CLOCK SIGNAL

BACKGROUND OF THE INVENTION

The present invention relates to an active pull-up circuit, and more particularly to an active pull-up circuit suitable for a dynamic memory circuit composed of field effect transistors.

Active pull-up circuits have been advantageously utilized in dynamic circuits, especially in dynamic memories in order to establish potentials equal to or above power supply voltages at predetermined circuit nodes. For example, in a dynamic memory, an active pull-up circuit is provided for each bit line. In this memory, a read-out signal produced on a bit line is once distinguished as one of the binary logic levels by a sense amplifier and thereafter in the case where the read-out signal is high, the potential of that bit line is pulled-up to in above a power supply voltage (Vcc) by the active pull-up circuit so that the pulled-up potential on that bit line is re-written into the addressed memory cell, as well as being taken out to an output circuit. In dynamic memories, active pull-up circuits must be provided for the respective bit lines and hence the number of the active pull-up circuits has become very large because of the recent increase in memory capacity of dynamic memories. Therefore, the whole area occupied by the active pull-up circuits and the whole power consumption caused by the active pull-up circuits in a dynamic memory have become important in evaluating a memory. For example, the typical, prior art active pull-up circuit is composed of four field effect transistors and a capacitor and is adapted to operate by two or more control signals. Therefore, it has been difficult to fabricate such prior art active pull-up circuits in the memory chip with ease.

SUMMARY OF THE INVENTION

It is one object of the present invention to provide an active pull-up circuit which can be fabricated with reduced number of elements.

It is another object of the present invention to provide an active pull-up circuit operable by a small power consumption and suitable for dynamic memories.

The active pull-up circuit according to the present invention comprises a first field effect transistor having a drain-source path coupled between a first circuit node to which a first signal is applied and a power voltage terminal, a second field effect transistor having a drain-source path coupled between the first circuit node and the gate of the first transistor and having a gate to which a second signal having the opposite phase to the first signal is applied, a capacitor having one end connected to the gate of the first transistor and the other end adapted to receive a clock signal.

According to the present invention, when the first circuit node is high while the second circuit node is low in potential, the second transistor assumes non-conducting state and the clock signal is directly applied to the first transistor. Thus, the power voltage is effectively supplied to the first circuit node. On the contrary, when the first and second circuit nodes are low and high in potential, respectively, the second transistor is rendered conducting to clamp the gate of the first circuit node at low level. Accordingly, the first transistor is kept non-conducting irrespective of the clock signal.

The active pull-up circuit thus constructed is composed of two transistors and a capacitor and requires no special clock signal which is raised above the power voltage, the integrated circuit having the large integration structure and operable with a small power consumption can be obtained.

DETAILED DESCRIPTION OF THE INVENTION

Figure 1:
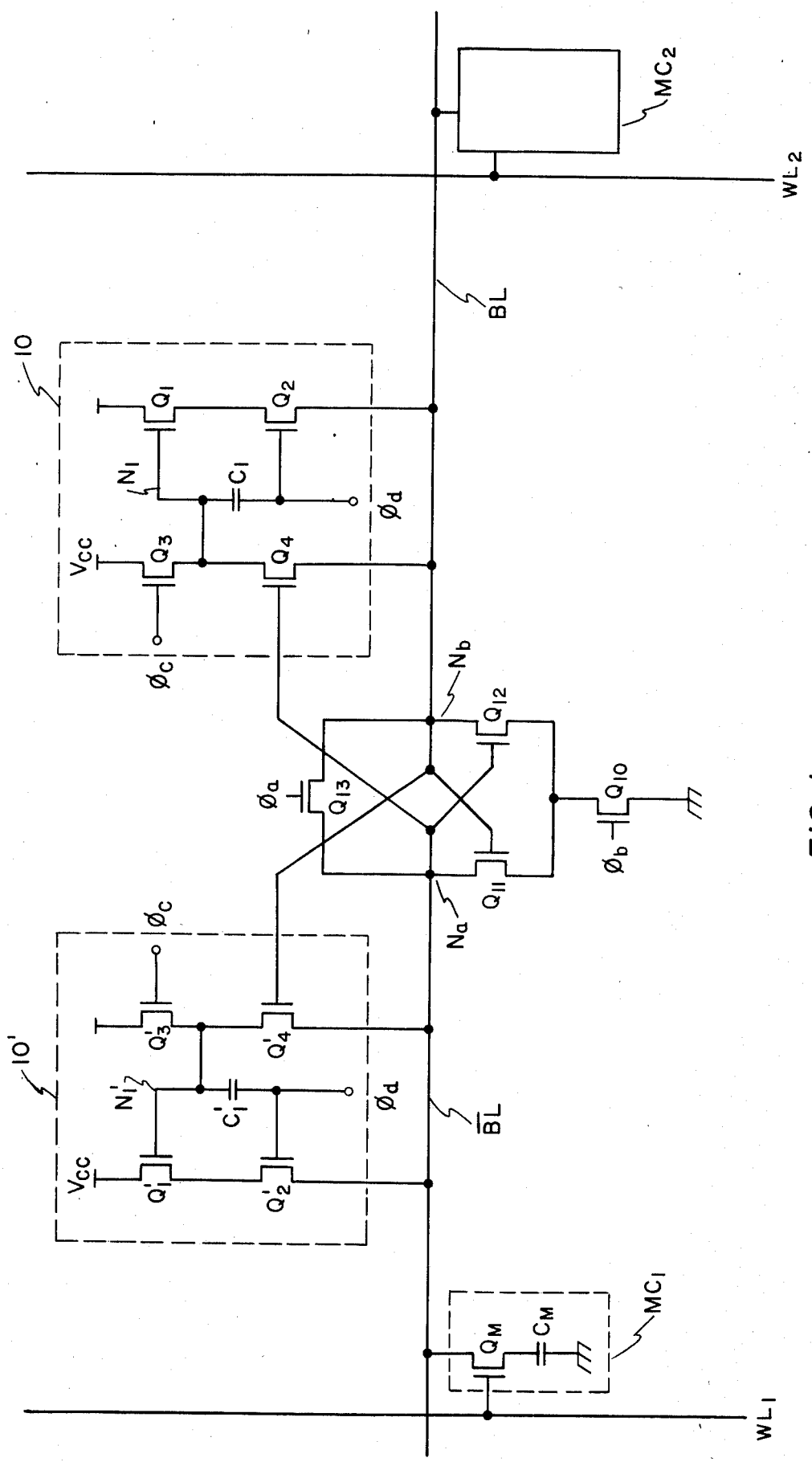
FIG. 1 is a schematic circuit diagram showing the major part of a memory employing prior art active pull-up circuits.

FIG. 1 shows a part of a memory circuit arrangement with the conventional active pull-up circuits. A pair of bit lines BL and $\overline{BL}$ are connected to a pair of input/output nodes Nb and Na of a sense amplifier composed of field effect transistors $Q_{10}$ to $Q_{13}$, respectively. Memory cells $MC_1$, $MC_2$—each composed of a cell transistor $Q_m$ and a capacitor $C_m$ are arranged in a known manner with respect to word lines $WL_1$, $WL_2$ and the bit lines. Active pull-up circuits 10 and 10' are provided for the bit lines 10 and 10', respectively. The pull-up circuit 10 operatively raises the potential of the bit line BL up to a power voltage Vcc when the potential of the bit line BL is higher than that of the bit line $\overline{BL}$.

Similarly, the pull-up circuit 10' operatively raises the potential of the bit line $\overline{BL}$ to the power voltage Vcc when the potential of the bit line $\overline{BL}$ is higher than that of the bit line BL. The pull-up circuit 10 is composed of transistors $Q_1$ to $Q_4$ and a capacitor $C_1$. Control clocks $\phi_c$ and $\phi_d$ are employed to operate the pull-up circuit 10. The pull-up circuit 10' connected to the bit line $\overline{BL}$ has the similar structure.

Figure 2:
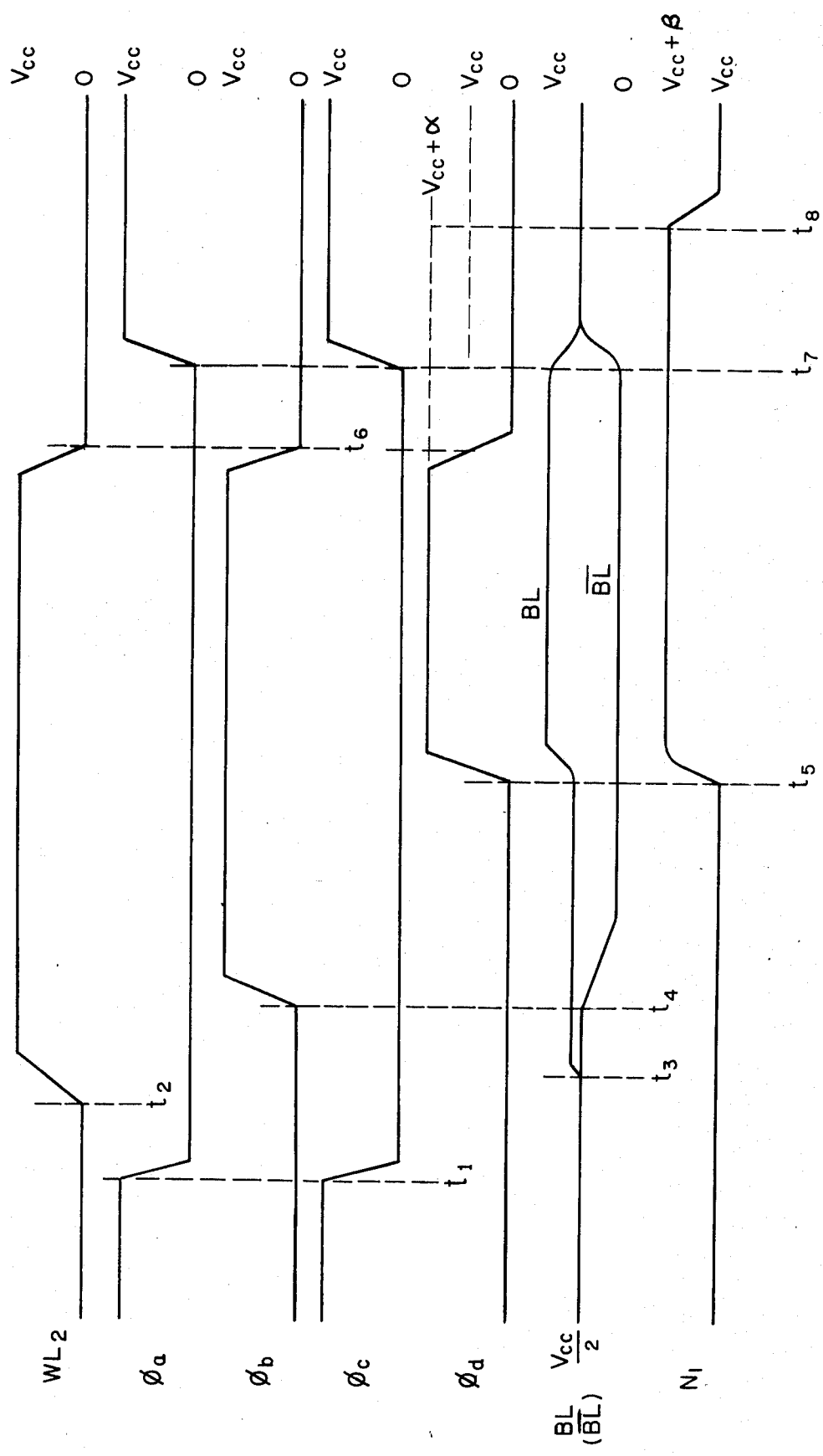
FIG. 2 is a timing chart showing an operation of the circuit of FIG. 1.

The operation of the circuit shown in FIG. 1 is described with reference to FIG. 2.

First, the signal $\phi_c$ is kept above the potential Vcc to render the transistors $Q_3$ and $Q_3'$ so that the nodes $N_1$ and $N_1'$ are charged to Vcc. Namely, the capacitors $C_1$ and $C_1'$ are charged to Vcc. Also, the transistor $Q_{13}$ is rendered conductive to set the bit lines $B_2$ and $\overline{BL}$ at a potential of Vcc/2 in response to a high level of the signal $\phi_a$. Then, the signals $\phi_a$ and $\phi_b$ are changed to low level at a time point $t_1$ that is the end of reset period. Subsequently, the word line e.g. $WL_2$ is driven towards a selection level from a time point $t_2$. In response thereto, a stored signal of the cell $MC_2$ storing "1" is read-out on the bit line BL to slightly raise the potential of the bit line BL from Vcc/2 at a time point $t_3$ while the potential of the bit line $\overline{BL}$ remains unchanged. Then, the signal $\phi_b$ changes from low level to high level thereby to enable the sense amplifier at a time point $t_4$ so that the charge at the bit line $\overline{BL}$ is discharged to the ground potential by the sense amplifier. Then, at a time point $t_5$, the signal $\phi_d$ is raised above the Vcc level so that the gate potential of the node $N_1$ is raised far above the Vcc level. Thus, the transistors $Q_1$ and $Q_2$ are conducting in non-saturated region, i.e. triode region to supply the bit line BL with the Vcc level. While, in this instance, the transistor $Q_4'$ in the pull-up circuit 10' assumes conducting state because the potential of the gate of the transistor $Q_4'$ is high so that the charge at the node $N_1'$ is discharged towards the ground potential through the transistors $Q_4'$ and $Q_{11}$. Thus, the potential the bit line $\overline{BL}$ remains low. Then, at a time point $t_6$, the word line $WL_2$ and the signals $\phi_b$ and $\phi_d$ return to low level to finish access operation. Then, at a time point $t_7$, the signal $\phi_a$ changes low level to high level thereby to set the bit lines BL and $\overline{BL}$ the same level of Vcc/2 and the signals returns to high level above the Vcc level. Thus, the reset period is introduced.

As has been described, four transistors $Q_1$ to $Q_4$ are required to form the pull-up circuit 10 and hence it has been difficult to fabricate the pull-up circuit in a small area. Moreover, in order to operate the circuit 10, two clock signals $\phi_c$ and $\phi_d$ are necessary, and the circuit structure for generating such signals has been complicated and consuming a relatively large power.

Figure 3:
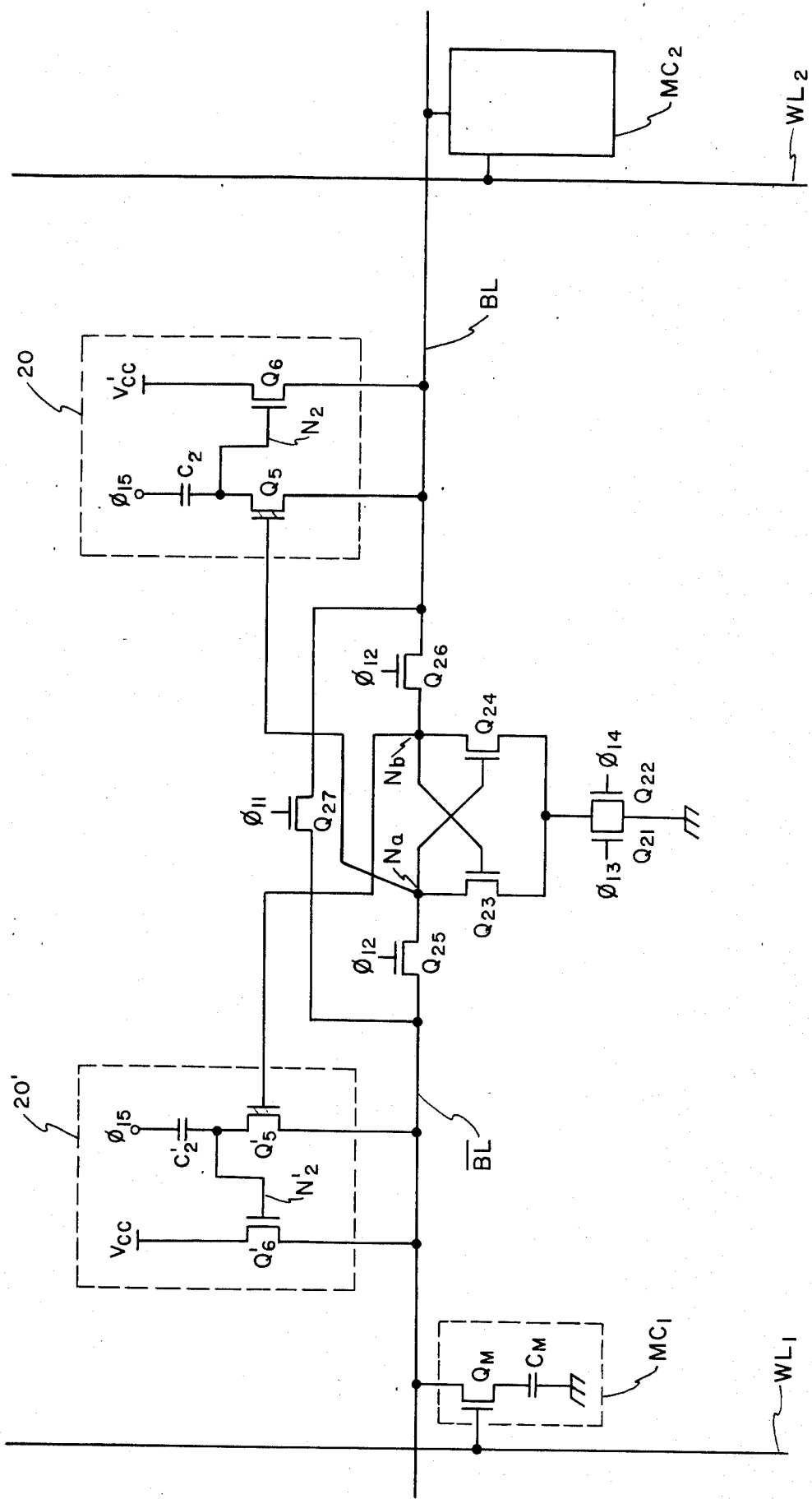
FIG. 3 is a schematic circuit diagram showing the major part of a memory employing the active pull-up circuits according to the present invention.

Referring to FIG. 3, a preferred embodiment of the present invention is described for the case where the active pull-up circuit of the invention is applied to a dynamic memory.

A pair of bit lines BL and $\overline{BL}$ are connected to a pair of input/output nodes Nb and Na of a sense amplifier composed of enhancement type FETs $Q_{21}$ to $Q_{27}$, via transfer gate transistors $Q_{26}$ and $Q_{25}$ of enhancement type FETs, respectively. An active pull-up circuit 20 provided to the bit line BL is composed of an enhancement type FET $Q_b$ having a drain-source connected between the bit line BL and the power voltage Vcc, a depletion type FET $Q_5$ having a source connected to the bit line BL and a gate connected to the input/output node Na, and a capacitor $C_2$ coupled between the drain of the transistor $Q_5$ and a clock terminal $\phi_{15}$. A active pull-up circuit 20' provided to the bit line $\overline{BL}$ has the similar structure. Here, a threshold voltage $V_{TD}$ of the depletion transistors $Q_5$ and $Q_5'$ is set as defined by "$0 > V_{TD} > -\frac{1}{2}$ Vcc".

Figure 4:
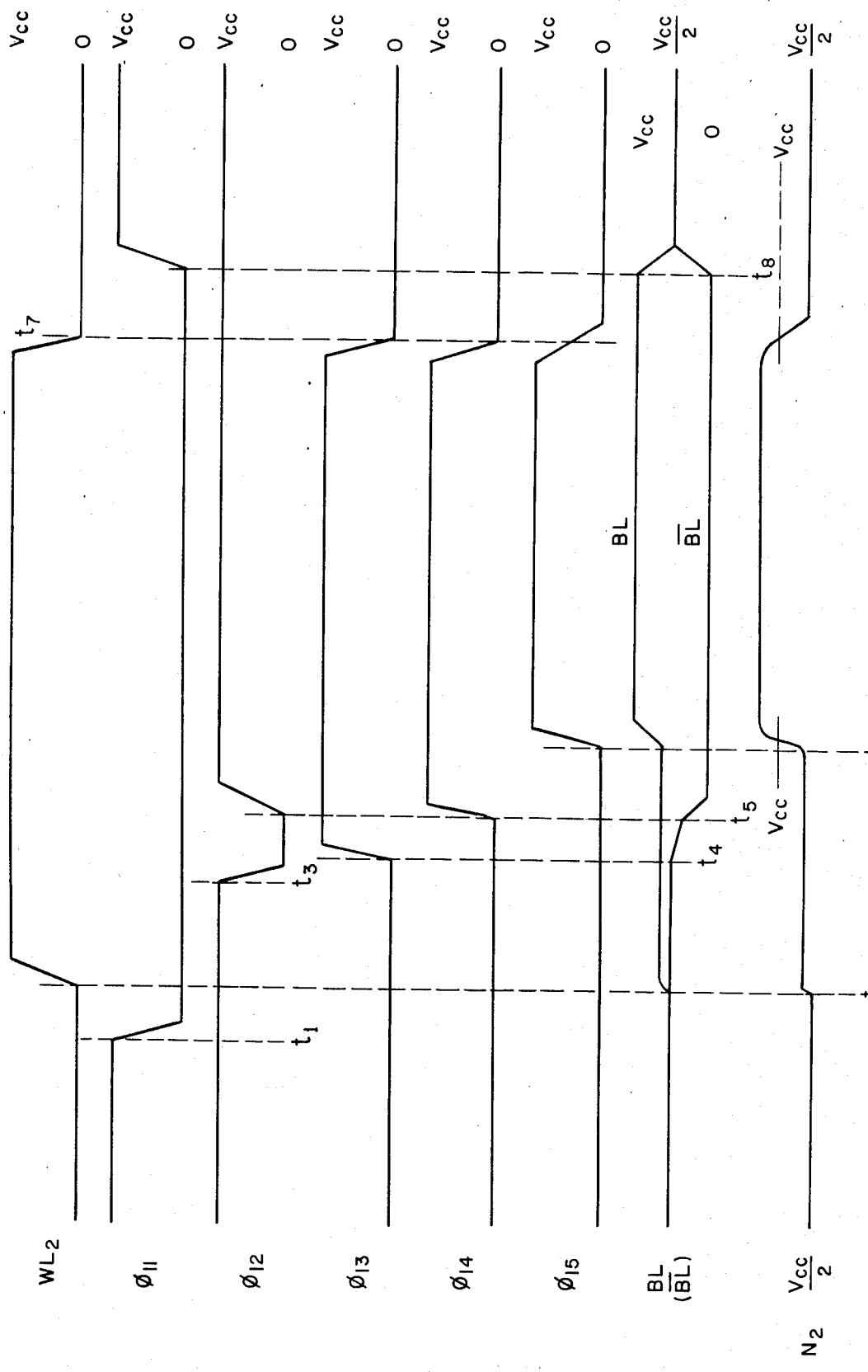
FIG. 4 is a timing chart showing an operation of the circuit of FIG. 3.

The operation of the circuit of FIG. 3 is described with reference to FIG. 4.

Prior to a time point $t_1$, a clock signal $\phi_{11}$ is high in level to keep potentials of the bit lines BL and $\overline{BL}$ at the same $\frac{1}{2}$ Vcc level. Also, the nodes $N_a$ and $N_b$ are set at the $\frac{1}{2}$ Vcc through the transistors $Q_{25}$ and $Q_{26}$. At a time point $t_1$, $Q_{11}$ changes from high level to low level to terminate a reset operation.

Then, at a time point $t_2$, the word line $WL_2$ is selected. In this case, it is assumed that the memory cell $MC_2$ addressed stores "1" level, and therefore the bit line BL is raised slightly in potential while the potential of the bit line $\overline{BL}$ remains at $\frac{1}{2}$ Vcc. The potentials of the bit lines BL and $\overline{BL}$ are transmitted to the nodes $N_b$ and $N_a$ via the transistors $Q_{26}$ and $Q_{25}$, respectively. Then, the signal $\phi_{12}$ changes from high to low level at a time point $t_3$ to render the transistors $Q_{25}$ and $Q_{26}$ non-conducting. Thus, the nodes $N_a$ and $N_b$ are isolated from the bit lines $\overline{BL}$ and BL, respectively. Under this condition, a clock signal $\phi_{13}$ changes from low level to high level at a time point $t_4$ to render the transistor $Q_{21}$. Thus, the sense amplifier commences amplification of the signal difference between the nodes $N_a$ and $N_b$. Then, at a time point $t_5$, $\phi_{12}$ returns to high level so that the bit lines BL and $\overline{BL}$ are electrically connected to the nodes $N_b$ and $N_a$. Simultaneously, a clock signal $\phi_{14}$ becomes active to render the transistor $Q_{22}$. The transistor $Q_{22}$ has larger current capability, i.e., conductance than the transistor $Q_{21}$, and hence the transistors $Q_{22}$ and $Q_{21}$ discharge the charge at the bit line $\overline{BL}$ effectively and rapidly. Thus, the bit line $\overline{BL}$ is discharged to the ground potential. Therefore, the transistor $Q_5$ is rendered non-conductive while the transistor $Q_5'$ is rendered conductive. Therefore, the potential at the node $N_2$ is slightly higher than $\frac{1}{2}$ Vcc while the potential at the node $N_2'$ is at the ground potential. Under this condition, the signal $\phi_{15}$ is raised to the Vcc level at a time point $t_6$.

Therefore, the potential at the node $N_2$ is raised above the Vcc level through the capacitor $C_2$ so that the transistor $Q_6$ is rendered conducting in the non-saturated region. Thus, the Vcc level is applied to the bit line BL without level reduction. While, since the transistor $Q_5'$ is conducting, the potential at the node $N_2'$ is kept at the ground level irrespective of the change of the signal $\phi_{15}$. Thus, the pull-up operation is achieved with respect to the bit line BL. Then, at a time point $t_7$, the word line $WL_2$ and the signals $\phi_{13}$, $\phi_{14}$ and $\phi_{15}$ return to low level and a reset period is introduced. Also, the signal $\phi_{11}$ returns to high level to render the transistor $Q_{27}$ conducting. Accordingly, the "1" level of the bit line BL and the "0" level of the bit line $\overline{BL}$ are short-circuit and both of the bit lines and the nodes Na and Nb are automatically charged to the $\frac{1}{2}$ Vcc level.

As described above, the active pull-up circuit according to the present invention can be fabricated by the reduced number of elements, i.e. two transistors and a capacitor and it promotes large integration structure. Furthermore, the pull-up circuit of the invention does not require any special clock signal which is raised above the power voltage Vcc. Accordingly, the circuit having simple circuit structure and operable with a small power consumption can be obtained.

We claim:

1. A field effect transistor circuit comprising first and second data nodes, means for setting said first and second data nodes at an intermediate level at a first timing, data means for applying a voltage difference between said first and second data nodes at a second timing which is subsequent to said first timing, and an active pull-up circuit which is operable only in response to a single control signal generated at a third timing which subsequent to said second timing, said active pull-up circuit being composed of only a first field effect transistor of an enhancement type having a source-drain path coupled between a power voltage terminal and said second data node, a second field effect transistor of a depletion type having a source-drain path coupled between said second data node and a gate of said first transistor and a gate connected to said first data node, and a capacitor having a first end connected to the gate of said first transistor and a second end for receiving said control signal, said intermediate level being set at approximately half the voltage at said power voltage terminal, said second transistor meeting the condition of $0 > VTD > -\frac{1}{2}$ Vcc, wherein Vcc represents the voltage at said power voltage and VTD represents the threshold voltage of said second transistor.

2. The circuit according to claim 1, in which said setting means includes a third field effect transistor having a source-drain path coupled between said first and second data nodes.

3. The circuit according to claim 1, in which said data means includes a flip-flop enabled at said second timing.

4. A field effect transistor circuit comprising first and second bit lines, a sense amplifier having first and second sense nodes, first means for connecting said first bit line to said first sense node, second means for connecting said second bit line to said second sense node, a plurality of memory cells coupled to said first and second bit lines, means for operatively setting said first and second bit lines at an intermediate voltage, means for operatively enabling said sense amplifier to discharge one of said first and second bit lines to a reference voltage without materially discharging the other bit line from said intermediate voltage, first and second pull-up circuits coupled to said first and second bit lines, respectively, each of said first and second pull-up circuits being composed of only two transistors and one capacitor and enabled by a single control signal which is generated after an enabling of said sense amplifier, the two transistors of said first pull-up circuit including a first field effect transistor of an enhancement type having a source-drain path coupled between a power voltage terminal and said first bit line, and a second field effect transistor of a depletion type having a source-drain path coupled between said first bit line and a gate of said first transistor and a gate coupled to said second bit line, the capacitor of said first pull-up circuit having a first end coupled to the gate of said first transistor and a second end for receiving said single control signal, the two transistors of said second pull-up circuit including a third field effect transistor of an enhancement type having a source-drain path coupled between said second bit line and said power voltage terminal, and a fourth field effect transistor of a depletion type having a source-drain path coupled between a gate of said third transistor and said second bit line and a gate coupled to said first bit line, and the capacitor of said second pull-up circuit having a first end coupled to the gate of said third transistor and a second end for receiving said single control signal, said intermediate voltage being approximately half the voltage at said power voltage terminal, said second and fourth transistors having a threshold voltage which is within the range of said reference voltage and $-\frac{1}{2}$ Vcc, wherein Vcc denotes the voltage at the power voltage terminal.

5. The circuit according to claim 4, in which said first means includes a fifth field effect transistor of an enhancement type having a source-drain path coupled between said first bit line and said first sense node, and said second means includes a sixth field effect transistor of an enhancement type having a source-drain path coupled between said second bit line and said second sense node.

6. The circuit according to claim 4, in which said setting means includes a seventh field effect transistor of an enhancement type having a source-drain path coupled between said first and second bit lines.

* * * * *